United States Patent [19]
Sakai

[11] Patent Number: 5,534,127
[45] Date of Patent: Jul. 9, 1996

[54] METHOD OF FORMING SOLDER BUMPS ON ELECTRODES OF ELECTRONIC COMPONENT

[75] Inventor: Tadahiko Sakai, Fukuoka, Japan

[73] Assignee: Matsushita Electric Industrial Co., Ltd., Osaka, Japan

[21] Appl. No.: 371,433

[22] Filed: Jan. 11, 1995

[30]     Foreign Application Priority Data

Jan. 11, 1994  [JP]  Japan .................................... 6-001145

[51] Int. Cl.$^6$ ................................................... C25D 5/02
[52] U.S. Cl. .......................... 205/125; 205/226; 205/252; 228/180.21; 228/180.22; 29/843
[58] Field of Search ...................... 205/125, 191, 205/226, 252; 228/180.21, 180.22; 29/885, 829, 843

[56]             References Cited

U.S. PATENT DOCUMENTS 4,950,272  8/1990  Dishon ..................................... 437/183
5,320,272  6/1994  Melton ............................... 228/180.21

Primary Examiner—John Niebling
Assistant Examiner—Brendan Mee
Attorney, Agent, or Firm—Pollock, Vande Sande & Priddy

[57]              ABSTRACT

A solder bump 3a is formed on an electrode 2 provided on a printed circuit board 1. First, a core 3 is formed on the electrode 2. Then, solder paste 3' is coated on the core 3 so as to cover an entire surface of the core 3. Subsequently, the solder paste 3' is heated until the solder paste 3' fuses together with the core 3, thereby forming the bump 3a on the electrode 2.

10 Claims, 3 Drawing Sheets

METHOD OF FORMING SOLDER BUMPS ON ELECTRODES OF ELECTRONIC COMPONENT

BACKGROUND OF THE INVENTION

1. Field of the Invention

The present invention relates to a method of forming solder bumps on electrodes or lands provided on the surface of an electronic component such as a printed circuit board or chip.

2. Prior Art

For realizing size reduction and densification of an electronic component, there is known a method of forming numerous electrodes arranged in a matrix on the surface of an electronic component and forming bumps (protruding electrodes) on such electrodes. Furthermore, there is known a method of coating solder paste on the electrodes by screen printing and thereafter heating an electronic component in a furnace of a fellow device, thereby melting the coated solder paste to form the bumps.

The screen printing is basically advantageous in that the solder bumps can be formed cheaply with better work efficiency. However, the screen printing necessarily requires heating a printed circuit board to melt the coated solder paste. During this heating operation of the printed circuit board in the furnace of the reflow device, there is a possibility that molten solder paste flows or spreads so widely that adjacent two solder bumps are integrated into a larger bump. Thus, it is feared that adjacent electrodes will be short-circuited by such undesirable integration or bridging of solder bumps. This problem will be explained in more detail with reference to FIGS. 3A, 3B and 3C.

FIGS. 3A, 3B and 3C explain steps of a conventional method of forming solder bumps. As shown in FIG. 3A, solder pastes 3—3 are coated on electrodes 2—2 formed on the surface of a printed circuit board 1 using the technology of a screen printing. A reference numeral 4 represents a resist film interposed between adjacent two electrodes 2 and 2. The Unexamined Japanese Patent Application No. HEI 3-20099/1991 discloses an example of a screen printing apparatus for coating such solder pastes 3—3.

Next, the printed circuit board 1 is transferred into the furnace of the reflow device, where each solder paste 3 is heated. The Unexamined Japanese Patent Application No. HEI 2-263570/1990 discloses an example of the reflow device. FIG. 3B shows a reflow condition where the molten solder paste 3 causes a side flow along the surface of the printed circuit board 1. Thus, the solder pastes 3, 3 on adjacent two electrodes 2 and 2 are integrated in a fairly large solder bump as shown in the drawing. Thus melted solder paste 3 will be drawn to one side if there is inside pressure imbalance caused by surface tension. For example, when the right side of the molten solder paste 3 has a lower inside pressure, almost all of the solder paste 3 is drawn to the right side as indicated by a dotted line of FIG. 3B. Such a flowing phenomenon possibly results in the formation of an excessively large bump 3a on one electrode 2 (i.e. the right-hand electrode) as indicated by a solid line in FIG. 3C or formation of a defective bump 3b and a bridge 3c short-circuiting adjacent two electrodes 2 and 2 as indicated by a dotted line in FIG. 3C.

In view of recent needs of realizing high integration and densification of electronic components, a pitch of each electrode 2 tends to be narrowed. Meanwhile, to surely solder a bump on a corresponding electrode of an opponent electronic component, it will be necessary to enlarge the volume of each bump. Under such severe circumstances, the recent mounting operation of electronic components inevitably encounters the above-described problem. The same problem will arise in a case where a bump is formed on an electrode on a wafer chip to form a flip chip.

SUMMARY OF THE INVENTION

Accordingly, in view of above-described problems encountered in the prior art, a principal object of the present invention is to provide a method of forming solder bumps capable of surely forming satisfactory solder bumps in a good shape on electrodes on an electronic component.

In order to accomplish this and other related objects, a first aspect of the present invention provides a method of forming a solder bump on an electrode provided on an electronic component, comprising steps of: forming a core of bump on the electrode of the electronic component; coating solder paste on the core so as to cover a surface of the core; and heating the solder paste until the solder paste fuses together with the core, thereby forming a bump on the electrode.

With this arrangement of the first aspect of the present invention, a core of bump is first formed on the electrode and then the solder paste is additionally coated around the core. Therefore, it becomes possible to form an adequately large volume bump. An excessively large bump or a bridge which was found in the prior art is no longer produced. Thus, it becomes possible to surely form a satisfactory bump in a good shape on an electrode of an electronic component having a narrowed pitch, preventing the solder paste from flowing along the surface of the electronic component.

In the above first aspect of the present invention, it is preferable that the core is made of solder. The solder paste is coated on the core using a screen printing technology. The electronic component is a printed circuit board. The core is formed into a spherical shape. The spherical configuration of the core gives a large surface on which the solder paste is effectively coated. Thus, it becomes possible to surely prevent the molten metal from flowing along the surface of the electronic component. Furthermore, the core is coated on the electrode using a screen printing technology. Alternatively, the core is formed by a solder precoat layer formed by an electrolytic plating.

A second aspect of the present invention provides a method of forming a solder bump on an electrode provided on an electronic component, comprising steps of: forming a first solder layer on the electrode of the electronic component; melting the first solder layer by a thermal processing so as to form a molten solder in a spherical shape; cooling down the spherical molten solder to form a hardened spherical core of bump; forming a second solder layer on the spherical core so as to cover a surface of the spherical core, a height of the second solder layer being higher than that of the spherical core; heating the second solder layer until the second solder layer fuses together with the core so as to form an integrated molten solder in a spherical shape; and cooling down the integrated molten solder to form a hardened spherical bump on the electrode.

With the arrangement of the second aspect of the present invention, a core of bump is formed in a spherical shape on the electrode and then an additional solder layer is coated around the spherical core. Therefore, it becomes possible to form an adequately large volume bump. Especially, the spherical configuration of the core gives a large surface on which the molten solder is coated. Thus, it becomes possible to surely prevent the molten solder from flowing along the surface of the electronic component. Accordingly, an excessively large bump or a bridge which was found in the prior art is no longer produced. Thus, in the same manner as the first aspect of the present invention, it becomes possible to surely form a satisfactory bump in a good shape on an electrode of an electronic component having a narrowed pitch, preventing the molten solder from flowing along the surface of the electronic component.

In the second aspect of the present invention, it is preferable that the first solder layer is coated on the electrode of the electronic component using a screen printing technology. The second solder layer is also coated on the core using a screen printing technology. The first solder layer is made of solder paste, and the second solder layer is also made of solder paste. The electronic component is a printed circuit board. Furthermore, a first screen mask is used for forming the first solder layer and a second screen mask is used for forming the second solder layer, the second screen mask being thicker than the first solder layer. Alternatively, the first solder layer is a solder precoat layer formed by an electrolytic plating.

A third aspect of the present invention provides a method of forming a bump on an electrode provided on an electronic component, comprising steps of: forming a fusible core of bump on the electrode of the electronic component; coating a fusible metal on the core so as to cover a surface of the core, the core having a better wettability to the coating metal than to the electrode of the electronic component; heating the coating metal until the coating metal fuses together with the core so as to form an integrated molten metal in a spherical shape; and cooling down the integrated molten metal to form a hardened spherical bump on the electrode.

With the arrangement of the third aspect of the present invention, a fusible core of bump is formed on the electrode of the electronic component. This fusible core has a better wettability to the fusible metal coated on the core than to the electrode of the electronic component. An excellent wettability between the core and the coating metal makes it possible to prevent the molten metal from flowing along the surface of the electronic component.

It is preferable in the above third aspect solder bump forming method that said core is formed in a spherical shape. The spherical configuration of the core gives a large surface on which the fusible metal is effectively coated. Thus, it becomes possible to surely prevent the molten metal from flowing along the surface of the electronic component. Accordingly, an excessively large bump or a bridge which was found in the prior art is no longer produced. Thus, in the same manner as the first aspect of the present invention, it becomes possible to surely form a satisfactory bump in a good shape on an electrode of an electronic component having a narrowed pitch, preventing the molten metal from flowing along the surface of the electronic component.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1A:
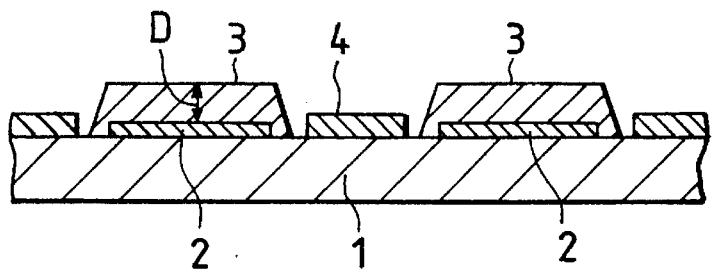
FIGS. 1A to 1E are cross-sectional views illustrating a method of forming solder bumps in accordance with a first embodiment of the present invention.
Figure 3A:
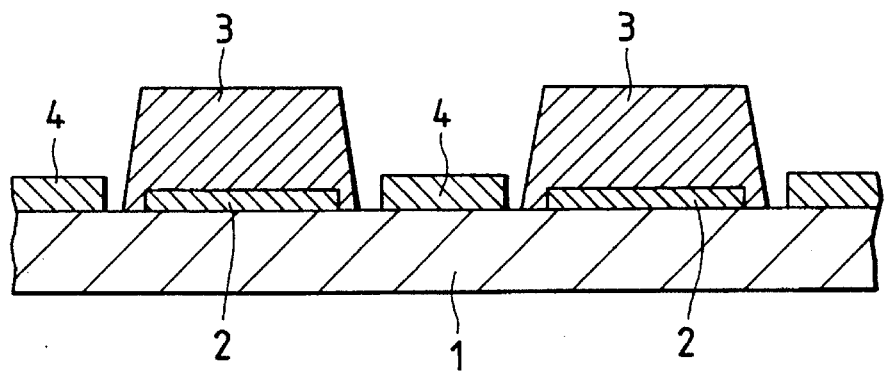
FIGS. 3A to 3C are cross-sectional views illustrating a conventional method of forming solder bumps.

Preferred embodiments of the method of forming solder bumps in accordance with a first embodiment of the present invention will be explained with reference to accompanying drawings. Identical parts are denoted by identical reference numerals throughout the figures. FIGS. 1A to 1E are cross-sectional views illustrating sequential steps of a method of forming solder bumps in accordance with the first embodiment of the present invention. First of all, as shown in FIG. 1A, a solder paste 3 is coated on each electrode 2 formed on a printed circuit board 1 using the technology of a screen printing. In this case, a screen mask used in a screen printing is relatively thin. Accordingly, a thickness D of the solder paste 3 coated on the electrode 2 is fairly thin compared with that of the conventional solder paste 3 shown in FIG. 3A. Hence, a total amount of solder paste 3 to be coated is small. To reduce the coating amount of the solder paste 3, it is preferable to reduce an area of a pattern hole of the screen mask.

Figure 1B:
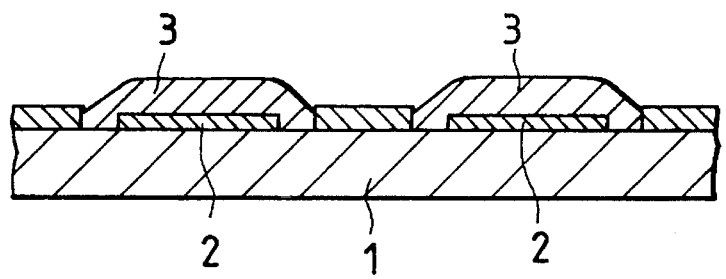
Figure 1C:
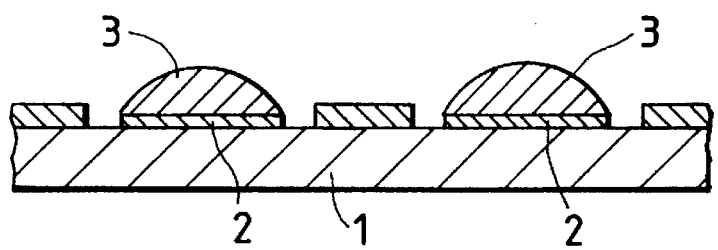
Figure 3B:
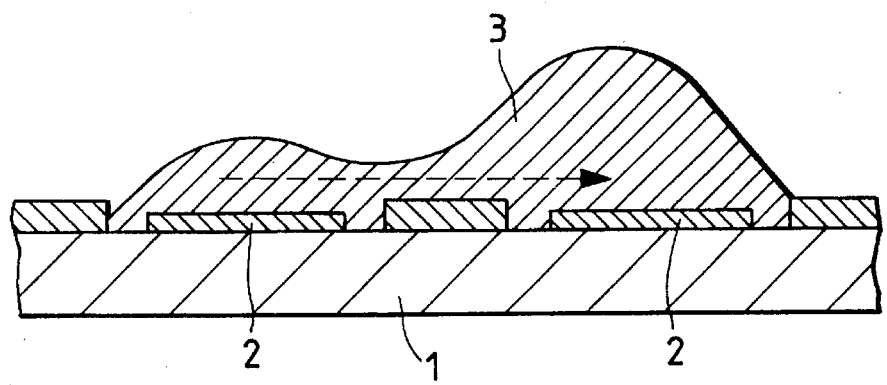
Figure 3C:
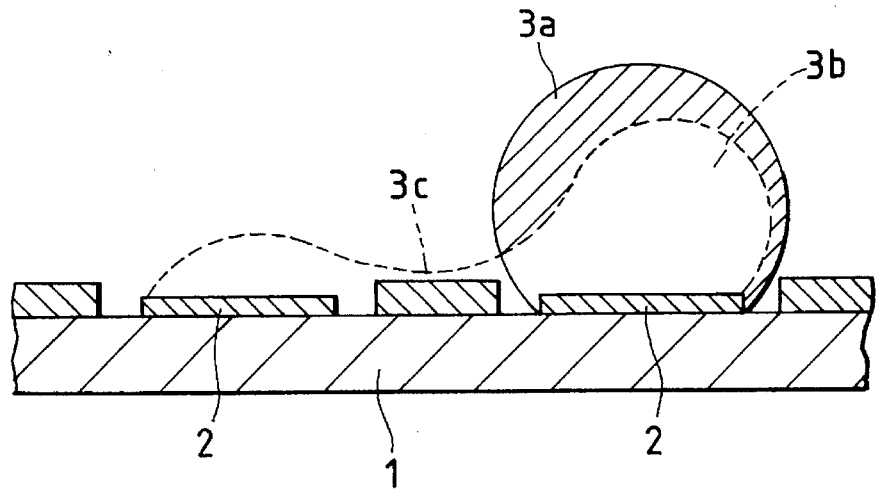

Next, the printed circuit board 1 is transferred into a furnace (not shown) of a reflow device (not shown), for applying a thermal processing to the printed circuit board 1 to melt the coated solder paste 3. FIG. 1B shows the partly melted condition of the solder pastes 3—3. When melted, the solder pastes 3—3 begin flowing along the surface of the printed circuit board 1. However, this embodiment is different from the conventional one shown in FIGS. 3A to 3C in that a total amount of the solder paste 3 coated on each electrode 2 is so small that no short-circuit is caused between two adjacent two electrodes 2 and 2 even when the cream solder 3 is completely melted in accordance with progress of reflow. Namely, as shown in FIG. 1C, the molten solder paste 3 is drawn or accumulated on the electrode 2 and rises or swells in a spherical shape due to surface tension acting on the surface of the solder paste 3. Subsequently, a cooling down processing is applied to the printed circuit board 1, to harden or cure the molten solder paste 3 keeping the spherical shape. The spherical solder paste 3 hardened or cured in this manner serves as a core of bump later described. Hereinafter, this is referred to as core of bump.

Figure 1D:
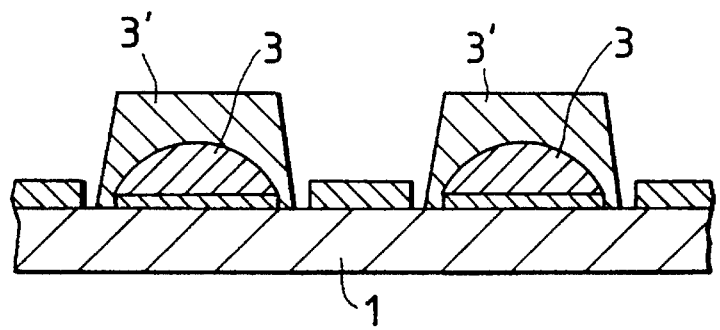

Next, as shown in FIG. 1D, a layer of solder paste 3' is coated on each electrode 2 so as to cover the spherical core 3 using the screen printing technology. A screen mask used for the formation of the layer of the solder paste 3' is sufficiently thicker than the height of the spherical core 3 so that the spherical core 3 can be completely covered by the solder paste 3'.

Figure 1E:
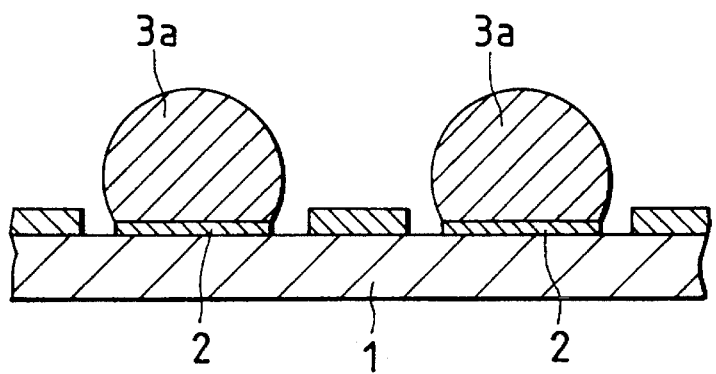

After that, the printed circuit board i is transferred into the furnace of the reflow device, where the printed circuit board i is heated and the solder paste 3' is melted. In this case, the material of the core 3 which is solder paste as described above is the same as that of the solder paste 3'. Therefore, there is found a fairly better wettability between the core 3 and the solder paste 3' compared with the wettability between the core 3 and the electrode 2. Furthermore, the core 3 has a large surface due to its spherical shape. For these reasons, the molten solder paste 3' is effectively drawn to the entire surface of the spherical core 3. Thus, the molten solder paste 3' is surely prevented from flowing along the surface of the printed circuit board 1. Hence, the molten solder paste 3' surely adheres on the surface of the core 3 as shown in FIG. 1E, keeping its configuration in a spherical shape by its surface tension. Thereafter, the molten solder paste 3' is fused together with the core 3 so as to form an integrated molten solder in a relatively large spherical shape. Then, the printed circuit board 1 is cooled down to harden or cure the integrated molten solder (i.e. the solder paste 3' and the core 3), thereby finally forming an adequate size bump 3a on the electrode 2.

As explained in the foregoing description, the first embodiment of the present invention first forms a small core 3 on the electrode 2 and then coats an additional solder paste 3' around the core 3. Therefore, it becomes possible to form a satisfactorily large volume bump 3a. Furthermore, the core 3 has an excellent wettability to the molten solder paste and the spherical configuration of the core 3 gives a large surface on which the molten solder paste 3' is coated. Thus, it becomes possible to prevent the molten solder paste 3' from flowing along the surface of the printed circuit board 1. In other words, there is no possibility of forming an excessively large bump or a bridge which was found in the prior art as explained.

Figure 2A:
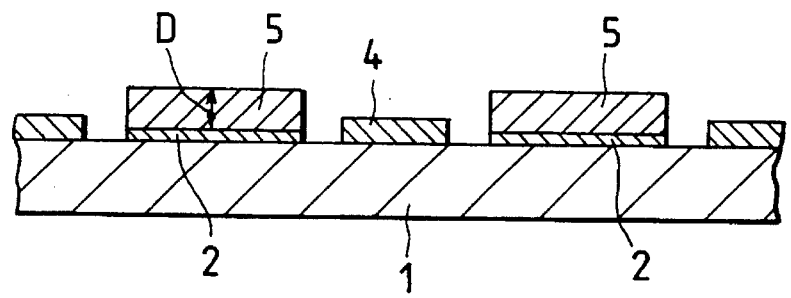
FIGS. 2A to 2D are cross-sectional views illustrating a method of forming solder bumps in accordance with a second embodiment of the present invention.
Figure 2B:
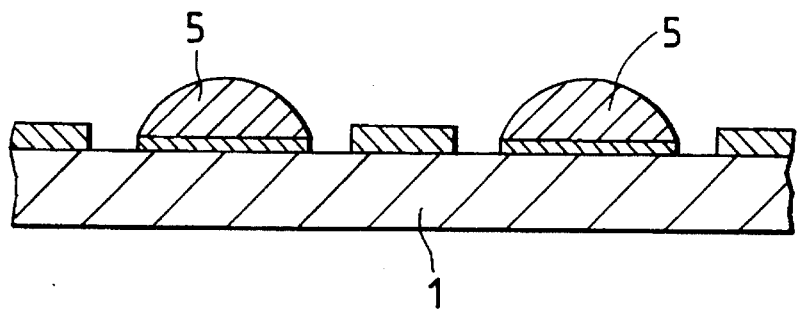
Figure 2C:
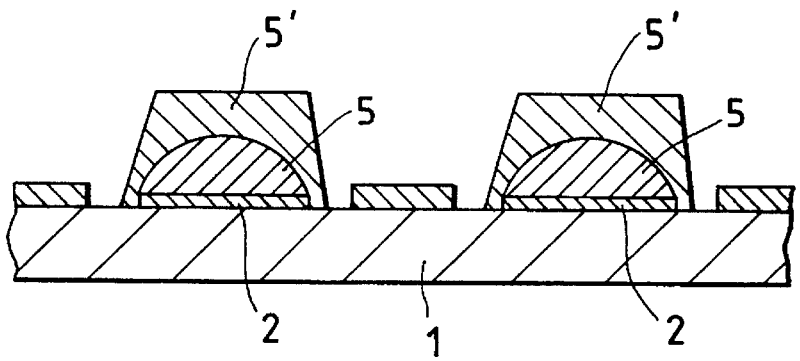

FIGS. 2A to 2D are cross-sectional views illustrating a method of forming solder bumps in accordance with a second embodiment of the present invention. First of all, a solder precoat layer 5 is formed on an electrode 2 by an electrolytic plating, as shown in FIG. 2A. A thickness D of the solder precoat layer 5 is fairly thin compared with that of the conventional solder paste 3 shown in FIG. 3A, in the same manner as the first embodiment of the present invention. Next, the solder precoat layer 5 it heated until is melts so fully that a semi-spherical core 5 is formed on the electrode 2 as shown in FIG. 2B. Thereafter, in the same manner as the steps of FIGS. 1D and 1E of the first embodiment, a layer of solder paste 5' is coated on each electrode 2 so as to cover the core 5 using the screen printing technology. A screen mask used for the formation of the layer of the solder paste 5' is sufficiently thicker than the height of the core 5 so that the core 5 can be completely covered by the solder paste 5', as shown in FIG. 2C.

Figure 2D:
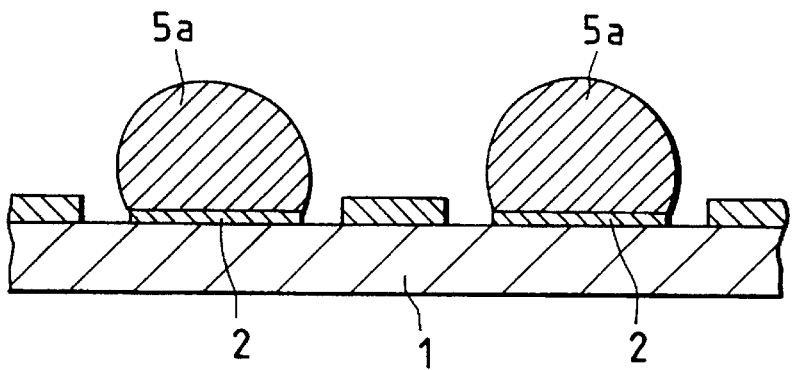

After that, the printed circuit board 1 is transferred into the furnace of the reflow device, where the printed circuit board 1 is heated to melt the solder paste 5'. In this case, the material of the core 5 is the same as that of the solder paste 5'. Therefore, there is found a fairly better wettability between the core 5 and the solder paste 5' compared with the wettability between the core 5 and the electrode 2. Furthermore, the core 5 has a large surface due to its spherical shape. For these reasons, the molten solder paste 5' is drawn to the entire surface of the spherical core 5. Thus, the molten solder paste 5' is surely prevented from flowing along the surface of the printed circuit board 1. Hence, the molten solder paste 5' surely adheres to the surface of the core 5 as shown in FIG. 2D, keeping its configuration in a spherical shape by its surface tension. Thereafter, the molten solder paste 5' is fused together with the core 5 so as to form an integrated molten solder in a spherical shape. Then, the printed circuit board 1 is cooled down to harden or cure the integrated molten solder (i.e. the solder paste 5' and the core 5), thereby finally forming an adequate size bump 5a on the electrode 2.

The electronic component employed for the present invention is not limited to the printed circuit board 1 only; for example, the method of the present invention can be applied to the fabrication of a flip chip which requires bumps formed on electrodes of a chip. If solder is used for the formation of core, a melting point of this solder core can be identical with or different from that of the solder paste.

As explained in the foregoing description, the present invention forms a core on an electrode of an electronic component and, then, coats fusible metal having a good wettability to the core so as to cover the core. After that, the coating metal is melted and hardened to form a bump. Thus, it becomes possible to surely form a satisfactorily large volume bump in a good shape on an electrode of an electronic component having a narrowed pitch, preventing the molten metal from flowing along the surface of the electronic component.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method of forming a solder bump on an electrode provided on an electronic component, comprising steps of:

forming a first solder layer on the electrode of the electronic component;

melting said first solder layer by a thermal processing so as to form a molten solder in a spherical shape;

cooling down said spherical molten solder to form a hardened spherical core of bump;

forming a second solder layer on said spherical core so as to cover a surface of said spherical core, a height of said second solder layer being higher than that of said spherical core;

heating said second solder layer until said second solder layer fuses together with said core so as to form an integrated molten solder in a spherical shape; and cooling down said integrated molten solder to form a hardened spherical bump on the electrode.

2. The solder bump forming method in accordance with claim 1, wherein said first solder layer is coated on said electrode of the electronic component using a screen printing technology.

3. The solder bump forming method in accordance with claim 1, wherein said second solder layer is coated on said core using a screen printing technology.

4. The solder bump forming method in accordance with claim 1, wherein said first solder layer is made of solder paste.

5. The solder bump forming method in accordance with claim 1, wherein said second solder layer is made of solder paste.

6. The solder bump forming method in accordance with claim 1, wherein said electronic component is a printed circuit board.

7. The solder bump forming method in accordance with claim 1, wherein a first screen mask is used for forming said first solder layer and a second screen mask is used for forming said second solder layer, said second screen mask being thicker than said first solder layer.

8. The solder bump forming method in accordance with claim 1, wherein said first solder layer is a solder precoat layer formed by an electrolytic plating.

9. A method of forming a bump on an electrode provided on an electronic component, comprising steps of:

forming a fusible core of bump on the electrode of the electronic component;

coating a fusible metal on said core so as to cover a surface of said core, said core having a better wettability to said coating fusible metal than to said electrode of the electronic component;

heating said coating fusible metal until said coating fusible metal fuses together with said core so as to form an integrated molten metal in a spherical shape; and cooling down said integrated molten metal to form a hardened spherical bump on the electrode.

10. The solder bump forming method in accordance with claim 9, wherein said forming step comprises the step of:

forming said fusible core of bump as a spherical shape on said electrode.

* * * * *